United States Patent
Lamb et al.

(10) Patent No.: US 9,748,929 B1
(45) Date of Patent: Aug. 29, 2017

(54) ENVELOPE-DEPENDENT ORDER-VARYING FILTER CONTROL

(71) Applicant: Analog Devices, Inc., Norwood, MA (US)

(72) Inventors: David Lamb, Medford, MA (US); Khiem Quang Nguyen, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/332,732

(22) Filed: Oct. 24, 2016

(51) Int. Cl.
*H03H 17/02* (2006.01)
*H03M 3/00* (2006.01)

(52) U.S. Cl.
CPC .......... *H03H 17/0294* (2013.01); *H03M 3/50* (2013.01)

(58) Field of Classification Search
None
See application file for complete search history.

(56) References Cited

U.S. PATENT DOCUMENTS

| | | | |
|---|---|---|---|
| 5,313,205 A | 5/1994 | Wilson | |
| 5,798,724 A * | 8/1998 | Myers | H03M 1/0863 341/146 |
| 7,522,658 B2 * | 4/2009 | Jensen | H04L 27/368 375/135 |
| 8,294,605 B1 | 10/2012 | Pagnanelli | |
| 9,362,875 B2 * | 6/2016 | Blyth | H03F 1/0227 |
| 2007/0254592 A1 * | 11/2007 | McCallister | H03F 1/0205 455/67.11 |

OTHER PUBLICATIONS

Kester, Walt, "Oversampling Interpolating DACs", Mt-017 Tutorial, Rev. A, 10/08, Wk, (Oct. 2008), 7 pgs.

* cited by examiner

*Primary Examiner* — Howard Williams
(74) *Attorney, Agent, or Firm* — Schwegman Lundberg & Woessner, P.A.

(57) ABSTRACT

A discrete-time (e.g., digital) filter can be used as an interpolation filter for processing an oversampled input signal, such as included as a portion of a sigma-delta digital-to-analog conversion circuit. An interpolation filter control circuit can be configured to adjust a filter order of the discrete-time interpolation filter at least in part in response to information indicative of an envelope signal magnitude. For example, higher-level input signals might be processed using an interpolation filter having a stop-band attenuation that is more stringently-specified (e.g., having greater attenuation) than a corresponding attenuation used for lower-level input signals. The filter order can be variable, such as varied in response to a detected envelope magnitude of the input signal to achieve power savings as compared to a filter having fixed parameters.

20 Claims, 11 Drawing Sheets $$H_{allpass} = \frac{k - z^{-1}}{1 - kz^{-1}}$$

ENVELOPE-DEPENDENT ORDER-VARYING FILTER CONTROL

FIELD OF THE DISCLOSURE

This document pertains generally, but not by way of limitation, to discrete-time (e.g., digital) filter control, and more particularly to digital filters having a variable filter order, such as controllable in response to an input signal characteristic.

BACKGROUND

Frequency-selective filters can be used in a variety of applications. For example, a filter having a low-pass response in the frequency domain can be used for suppression of image frequencies when the filter is used as an interpolation filter, such as included as a portion of an oversampling sigma-delta digital-to-analog conversion circuit. The interpolation filter can be implemented as a digital filter, such as having a fixed stop-band attenuation and a fixed cut-off frequency. Generally, discrete-time filter characteristics such as filter type (e.g., frequency response, topology) and performance (e.g., stop-band attenuation, rate of roll-off, cut-off frequency) are established in relation to overall system specifications, and a corresponding filter parameters such as filter order are then fixed.

SUMMARY OF THE DISCLOSURE

An electronic circuit or system can include a discrete-time (e.g., digital) filter. For example, a discrete-time filter can be used as an interpolation filter for processing an oversampled input signal, such as included as a portion of a sigma-delta digital-to-analog conversion circuit. The electronic circuit or system can be configured to provide information indicative of an envelope of a discrete-time input signal. An interpolation filter control circuit can be configured to adjust a filter order of the discrete-time interpolation filter at least in part in response to information indicative of an envelope signal magnitude. For example, higher-level input signals might be processed using an interpolation filter having a stop-band attenuation that is more stringently-specified (e.g., having greater attenuation) than a corresponding attenuation used for lower-level input signals. In this manner, overall system performance is maintained and power efficiency can be enhanced as compared to using a single stop-band attenuation for all input signals.

In an example, a signal processing circuit can be configured to control a discrete-time interpolation filter having an adjustable filter order, the signal processing circuit comprising a discrete-time signal input, a discrete-time peak detector circuit coupled to the discrete-time signal input, the discrete-time peak detector circuit configured to provide information indicative of an envelope signal of a discrete-time signal received from the discrete-time signal input, the envelope signal having an envelope bandwidth less than a bandwidth of the discrete-time signal, and an interpolation filter control circuit configured to adjust a filter order of the discrete-time interpolation filter at least in part in response to information indicative of an envelope signal magnitude.

A sigma-delta over-sampling digital-to-analog conversion circuit, comprising a discrete-time signal input, a discrete-time interpolation filter having an adjustable filter order, an envelope detector circuit coupled to the discrete-time signal input, the envelope detector circuit configured to provide information indicative of an envelope signal of a discrete-time signal received from the discrete-time signal input, the envelope signal having an envelope bandwidth less than a bandwidth of the discrete-time signal, and an interpolation filter control circuit configured to adjust a filter order of the discrete-time interpolation filter at least in part in response to information indicative of an envelope signal magnitude, a discrete-time sigma-delta modulator coupled to an output of the discrete-time interpolation filter, a current-mode digital-to-analog conversion (DAC) circuit coupled to the output of the discrete-time sigma-delta modulator, the current-mode DAC configured to provide an analog output signal representative of the discrete-time input signal.

In an example, a technique such as a method can include controlling a discrete-time interpolation filter having an adjustable filter order, the method comprising receiving a discrete-time signal, detecting an envelope signal of a discrete-time signal using a discrete-time peak detector, the envelope signal having an envelope bandwidth less than a bandwidth of the discrete-time signal, determining an envelope signal magnitude, and adjusting a filter order of a discrete-time interpolation filter at least in part in response to information indicative of the envelope signal magnitude.

This summary is intended to provide an overview of subject matter of the present patent application. It is not intended to provide an exclusive or exhaustive explanation of the invention. The detailed description is included to provide further information about the present patent application.

Figure 1:
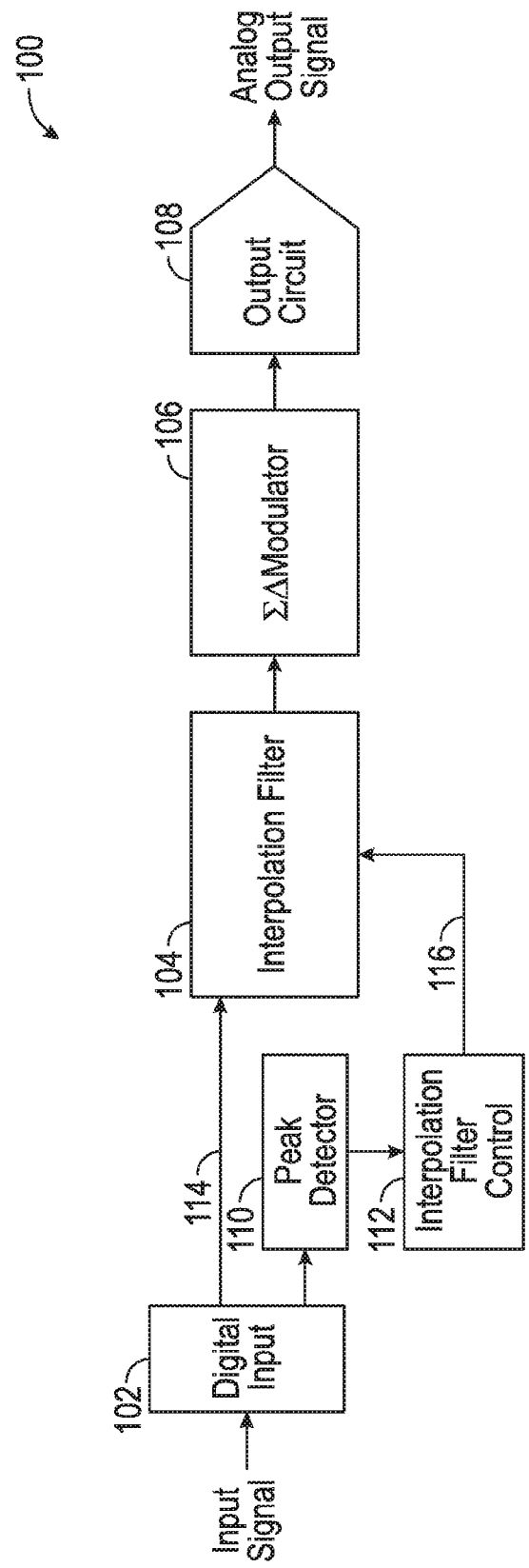
FIG. 1 illustrates generally an example that can include an electronic system, such as to provide an oversampling sigma-delta digital-to-analog converter circuit.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, that in an electronic system, using one or more of a fixed filter topology or a fixed filter order can lead to inefficiency, such as power consumption inefficiency. More particularly, a frequency-selective filter having one or more of a specified cut-off frequency, a specified roll-off-rate, or a specified stop-band attenuation may significantly exceed minimum performance specifications in certain situations if such a filter is specified too conservatively. For example, a stop-band attenuation may be established assuming a specified peak input signal magnitude, but lesser attenuation factors might be adequate for input signals having a magnitude less than the peak amplitude. In order to provide a robust system, the stop-band attenuation may nevertheless be fixed at a "worst-case" value corresponding to the specified peak input signal.

By contrast, the present inventors have recognized that a filter order can be variable, such as varied in response to a detected envelope magnitude of the input signal to improve system efficiency, such as to achieve power savings. Other filter parameters can be varied, such as cut-off frequency or roll-off (e.g., filter attenuation) versus frequency. One or more of a variable stop-band attenuation, a variable roll-off rate, or a variable cut-off frequency can be adjusted dynamically, such as in response to one or more input signal characteristics. Such adjustment can be referred to as "real-time," although such operation need not require instantaneous adjustment or response to the one or more input signal characteristics. A discrete-time (e.g., digital) filter can be controlled such as having an adjustable filter order. The filter order can be adjusted dynamically, such as to provide a lower filter order in a reduced-power-consumption mode, and a higher filter order in a higher-performance mode.

As an illustrative example, a discrete-time interpolation filter can be used as a portion of an oversampling sigma-delta digital-to-analog conversion circuit. An input signal, such as a discrete-time (e.g., digital) input signal can vary in amplitude. For example, the input signal can include a time-domain wave shape having an envelope, where the envelope can be represented as a signal having a bandwidth less than a total bandwidth of the input signal, but having a magnitude following peaks in the magnitude of the input signal. A magnitude of the envelope signal can be used to adjust a stop-band attenuation factor of the interpolation filter (or one or more other filter characteristics), such as by adjusting a filter order of the interpolation filter. The stop-band attenuation factor of the interpolation filter may be specified in terms of a desired attenuation factor, a desired noise floor, or a desired noise spectral density, as illustrative examples.

FIG. 1 illustrates generally an example that can include an electronic system 100, such as to provide an oversampling sigma-delta digital-to-analog converter circuit. An input signal can be provided to a digital input 102. For example, the digital input can include an interface at an "edge" of the electronic system 100 or within the system 100, such as included as a portion of an electronic assembly, an integrated circuit package (e.g., a multi-circuit module), or an integrated circuit die. The digital input 102 can include a serial interface configured to receive a discrete-time signal in a serial manner. One or more outputs of the digital input 102 can be routed to other portions of the electronic system 100. For example, an output 114 can be routed to a discrete-time filter, such as an interpolation filter 104. The output 114 can be an upsampled representation of the input signal, such as having zero-valued discrete-time samples inserted between the original samples comprising the input signal, accordingly the output signal 114 can possess a higher data rate than the original input signal. The interpolating filter 104 can provide a low-pass response, such as implemented as an infinite impulse response (IIR) "half band filter," to interpolate between the discrete-time samples in the original input signal across the zero-valued discrete-time samples, providing an interpolated upsampled signal to a sigma-delta modulator 106. The output of the sigma-delta modulator 106 can be provided to an output circuit 108, such as current-mode digital-to-analog (DAC) converter, and the current-mode DAC can be coupled to or can include an output stage comprising a current-to-voltage converter circuit, to provide a voltage-mode analog output signal, the analog output signal corresponding to the digital input signal received by the digital input 102.

As mentioned above, the present inventors have recognized, among other things, that the interpolation filter 104 need not be a fixed-order filter, and can have a variable filter order. As an illustrative example, an output of the digital input 102 can be coupled to a peak detector circuit 110, such as discrete-time peak detector circuit. The peak detector circuit 110 (such as having a topology as shown illustratively in FIG. 2) can provide information indicative of an envelope signal of the discrete-time input signal received at the digital input 102. Generally, the envelope signal has a bandwidth less than a full bandwidth of the input signal, and the envelope signal magnitude is constrained such that the envelope signal does not include values lesser in magnitude than a corresponding magnitude of the input signal when the envelope and input signals are temporally aligned. As illustrative examples, a bandwidth ratio between the envelope signal bandwidth and the full input signal bandwidth can be 10:1, 100:1, or 1000:1, or another value. For example, in an audio bandwidth application, the envelope signal bandwidth can be 20 Hertz or more, and the input signal bandwidth can include a Nyquist rate of 22 kilohertz or 24 kilohertz. Such numerical examples are illustrative and non-restrictive.

Information indicative of the envelope signal magnitude can be provided to an interpolation filter control circuit 112. An output 116 of the interpolation filter control circuit 112 can be used to control the interpolation filter. The output 116 can include one or more of an output of a comparator (e.g., a binary output), information indicative of a magnitude value, or information related to one or more filter coefficients, as shown and described in relation to other examples in this document.

Figure 2:
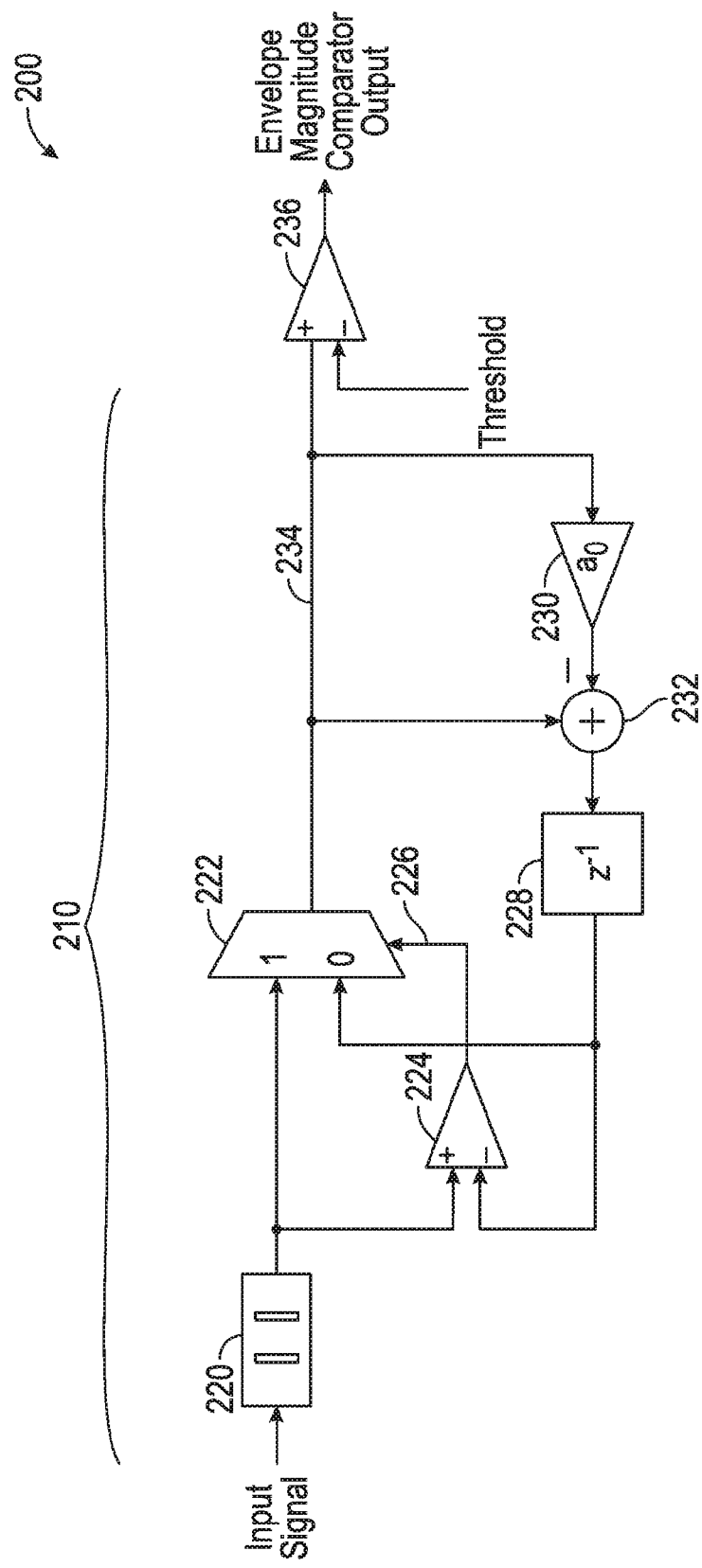
FIG. 2 illustrates generally an example that can include a peak detector circuit, such as can be used to extract envelope information from an input signal.

FIG. 2 illustrates generally an example 200 that can include a peak detector circuit 210, such as can be used to extract envelope information from an input signal. In examples herein, the term "circuit" can refer to an application-specific circuit permanently configured as shown in FIG. 2, or the circuit can include a processor circuit or other configurable circuit arranged to perform the operations shown schematically in FIG. 2. The peak detector circuit 210 is an illustrative example that can be realized as a discrete-time (e.g., digital) peak detection scheme, but other peak detection techniques can be used in combination with other examples described herein. In the example 200 of FIG. 2, a discrete-time input signal can be provided to a magnitude detector (e.g., an "absolute value" detector) 220. An output indicative of the absolute value of a sample of the input signal can be provided to a first input of a first comparator 224. The second input of the comparator can be coupled to a delay element 228, such as to provide a comparison between a present magnitude sample and information indicative of a prior sample, or a decaying representation of a prior sample. The first comparator 224 can be used to control whether the decaying representation of prior samples (corresponding to input "0") is provided at a multiplexer 222 output 234 versus a new peak sample (corresponding to input "1"). The multiplexer output 234 can be routed to a summing junction 232, and another input of the summing junction (e.g., a subtracting input) can be coupled to a decay factor multiplier 230. For example, a peak decay factor can be represented as "$a_0$," and can have a value less than unity in magnitude. The output 234 of the multiplexer can include a discrete-time representation of an envelope of the input signal to the peak detector circuit 210.

The output of the multiplexer 234 can be used as an output of the peak detector circuit 210, such as providing a signal representative of an envelope of the input signal, such as for use in controlling a variable-order filter circuit. For example, in FIG. 2, an envelope magnitude comparator 236 can be used to compare the envelope signal magnitude against a specified threshold, and the envelope magnitude comparator 236 can include an output coupled to another circuit such as a filter control circuit, for use by the filter control circuit in adjustment of the filter order in response to the comparison. As an illustrative example, the filter control circuit can be configured to increase a stop-band attenuation by increasing the interpolation filter order when the comparator indicates that the envelope signal magnitude is above the specified threshold. In this example, there is only a binary control output provided by the envelope magnitude comparator. Other approaches can be used, such as using a window comparator scheme to provide other indicia of intermediate envelope magnitudes. For example, the filter control circuit can be configured to adjust the filter order to a specified order corresponding to a range of envelope signal magnitudes, and multiple range "buckets" could be used having a specified filter order corresponding to a specified input envelope range.

Figures 3A, 3B:
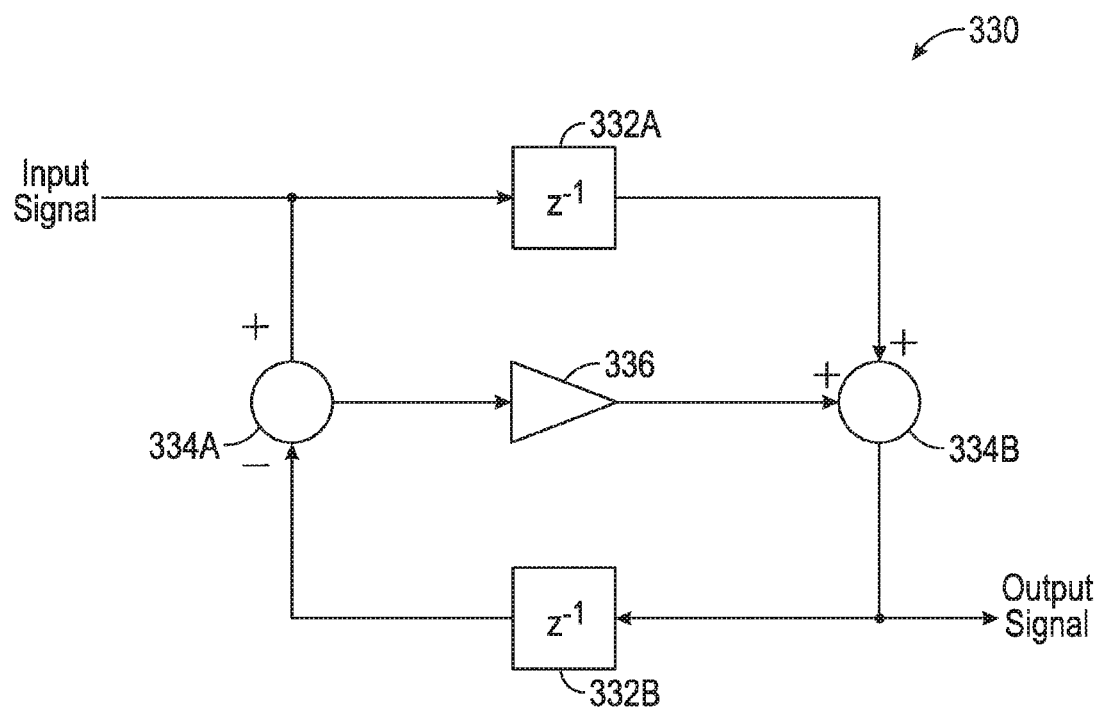
FIG. 3A illustrates generally an illustrative example of a discrete-time filter section comprising an "all-pass" topology.
FIG. 3B illustrates generally a transfer function representation of the response of the all-pass filter topology of FIG. 3A.

FIG. 3A illustrates generally an illustrative example of a discrete-time filter section 330 comprising an "all-pass" topology. As mentioned above, a discrete-time filter can be used for a variety of applications, such as to provide an interpolation filter within a digital-to-analog converter circuit. In one approach, a half-band infinite impulse response (IIR) filter can be provided, such as by cascading (e.g., "summing") all-pass sections. In the approach shown in FIG. 3A, the IIR structure includes a sum of two branches of cascaded all-pass sections. A discrete-time input signal can be fed to a first summing junction 334A and to a first delay element 332A. An output of the first summing junction can be multiplied by a filter coefficient at 336, and fed to a second summing junction 334B. A second input of the second summing junction 334B can be coupled to an output of the first delay element 332A. An output of the second summing junction 334B can be fed back to a subtracting input of the first summing junction 334A through a second delay element 332B. A transfer function representation of the response of the all-pass filter section 330 is shown illustratively in FIG. 3B, where the transfer function $H_{all-pass}$ is a function of the filter coefficient, "k," provided at 336 in FIG. 3A, along with values of the prior sample.

Generally, the coefficient, "k" is always between zero and unity. The half-band filter response is established because the all-pass sections are generally first-order sections. The coefficient "k" is between zero and unity to provide a stable transfer function. A similar technique could be used for non-half-band filter implementable as a sum-of-all-pass, where filter sections can be second-order. However, such an approach can present challenges because the control of the coefficients would become more complex if un-stable intermediate filters are to be avoided.

The filter order of the half-band filter can be varied such as by adding or omitting respective cascaded all-pass filter sections. When the filter coefficient, "k" is assigned a value of unity ("1"), then the all-pass filter section has a transfer function identically equal to unity, as if the filter section were omitted. This occurs because the numerator and denominator of the transfer function shown in FIG. 3B each become $1-z^{-1}$ when k=1, and $[1-z^{-1}]/[1-z^{-1}]=1$. For a discrete-time (e.g., digital) filter realization, calculations corresponding to an all-pass filter section having a coefficient, k=1, can be omitted because the filter section is making no contribution other than passing the input signal without modification. If a variable order filter is desired, such a variable-order filter can be realized by transitioning one or more all-pass coefficients corresponding to respective filter sections from an initial value to a target value. Filter sections having a respective initial filter coefficient k=1 can be omitted initially and can be respectively instantiated or otherwise included when k≠1, and similarly, filter sections having a respective target filter coefficient k=1 after ramping can be omitted once their filter coefficients are within a specified margin of k=1. As mentioned above, omission of all-pass filter sections can be accomplished by suppressing calculation corresponding to the omitted section, or if a dedicated hardware-implemented filter section is used, use or operation of the hardware-implemented filter block can be suppressed. In either example (suppression of calculations and/or inhibition of operation of the hardware block) can provide power savings.

As shown and described in relation to other examples herein, an abrupt (e.g., instant) transition from one set of filter coefficients to another can induce undesired time-domain artifacts. Accordingly, the present inventors have recognized that one or more coefficients can be transitioned through a series of intermediate values, such as by ramping the one or more coefficients over time. A duration of such ramping can influence a degree of waveform distortion induced when transitioning from an initial filter order to a target filter order.

Figure 4:
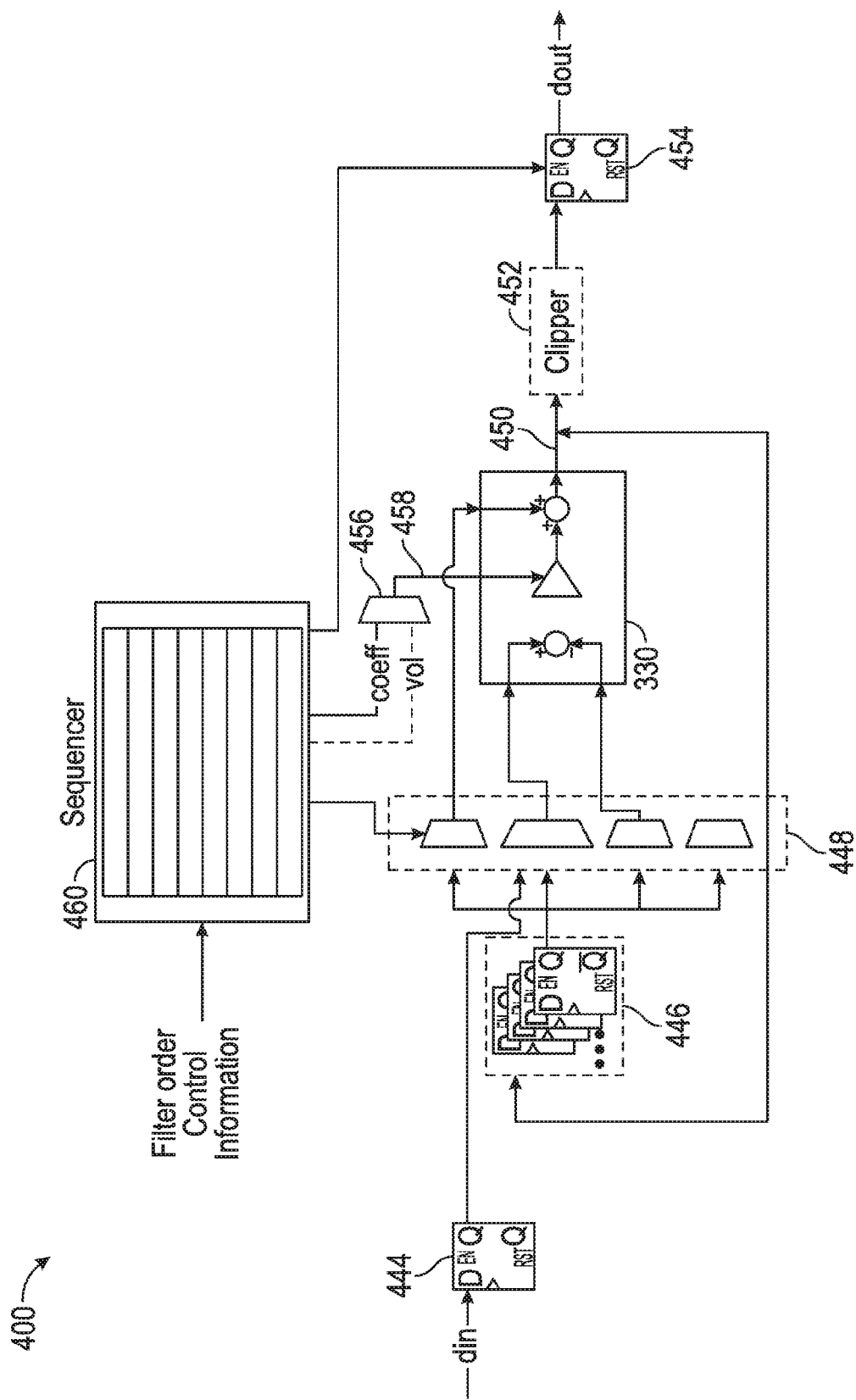
FIG. 4 illustrates generally at least a portion of an electronic system, such as can include a sequencer, a memory circuit, and a discrete-time filter circuit, such as can be used to provide an adjustable filter circuit order.

FIG. 4 illustrates generally at least a portion of an electronic system 400, such as can include a sequencer 460, a memory circuit 446, and a discrete-time filter circuit 330, such as can be used to provide an adjustable filter circuit order. In the example of the system 400 of FIG. 4, a serial representation of a discrete-time (e.g., digital) input signal, "din," can be provided on a sample-by-sample basis to an input latch 444. Filter order control information can be provided to the sequencer 460, such as for use in controlling a multiplexer array 448 on a sample-by-sample basis. The sequencer can include one or more outputs for providing filter control information to the discrete-time filter circuit 330, such as including one or more coefficients (e.g., "coeff") or an amplitude scaling factor (e.g., volume or "vol"), from an output 458 of a multiplexer. In the example shown in FIG. 4, a first order discrete-time filter circuit 330 can be re-used in a serial or sequential manner to provide a response equivalent to a higher-order, such as by varying the filter coefficient provided at the output 458, and by controlling the multiplexer array 448 to properly feedback prior outputs. The prior outputs can be stored in the memory circuit 446 (such as comprising a flip-flop array or other discrete-time information storage elements). As the filter order of the filter circuit 330 is varied, calculation of higher-order filter contributions can be omitted when the corresponding filter coefficient is within a specified margin of k=1, such as under the control of the sequencer 460. A discrete-time clipping circuit 452 can be included optionally, and an output of the filter circuit 330 can be latched using an output latch 454 to provide a discrete-time (e.g., digital) output, "dout." The system 400 of FIG. 4 can be referred to generally as a wave-filter engine and can be implemented using application-specific hardware elements, or configurable elements such as included as a portion of a programmable logic device, as illustrative examples.

Figure 5A:
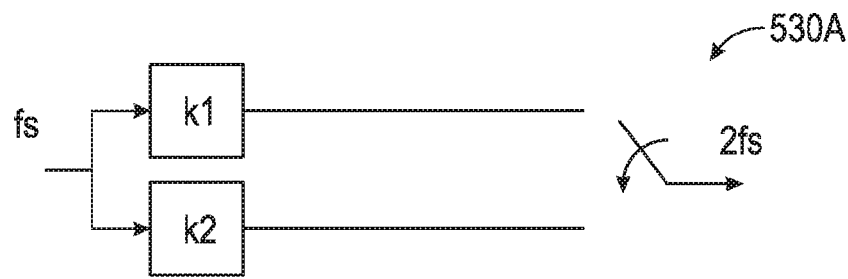
FIG. 5A illustrates generally an example of a first discrete-time filter implementation having a first specified filter order.

FIG. 5A illustrates generally an example of a first discrete-time filter implementation 530A having a first specified filter order. Elements k1 and k2 in FIG. 5A can represent respective all-pass sections having first and second filter coefficients, respectively. A discrete-time input signal can be provided, having a first sample rate, "$f_s$," and an output of the filter implementation 530A can be provided such as by switching between the parallel paths defined by elements k1 and k2, such as to provide an output having a second sampling rate, "$2f_s$." The filter topology shown in FIG. 5A can provide, as an illustrative example, a $5^{th}$-order half-band infinite impulse response filter defining a low-pass response, and having a stop-band attenuation of about 25 decibels (25 dB).

Figure 5B:
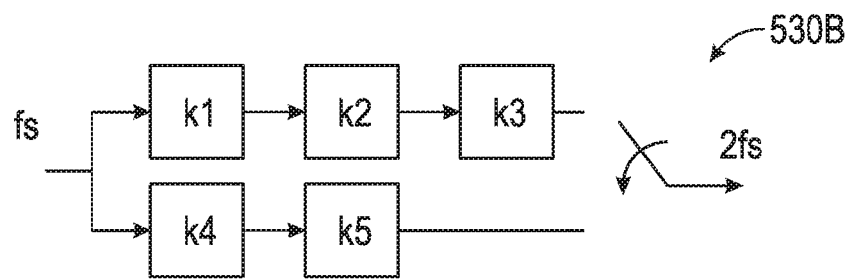
FIG. 5B illustrates generally an example of a second discrete-time filter implementation having a second specified filter order.

FIG. 5B illustrates generally an example of a second discrete-time filter implementation 530B having a second specified filter order. Elements k1, k2, k3, k4, and k5 in FIG. 5B can represent respective all-pass sections having respective filter coefficients. A discrete-time input signal can be provided, having a first sample rate, "$f_s$," and an output of the filter implementation 530B can be provided such as by switching between the parallel paths, such as to provide an output having a second sampling rate, "$2f_s$." The filter topology shown in FIG. 5B can provide, as an illustrative example, a $11^{th}$-order half-band infinite impulse response filter defining a low-pass response, and having a stop-band attenuation of about 75 decibels (25 dB).

Figure 5C:
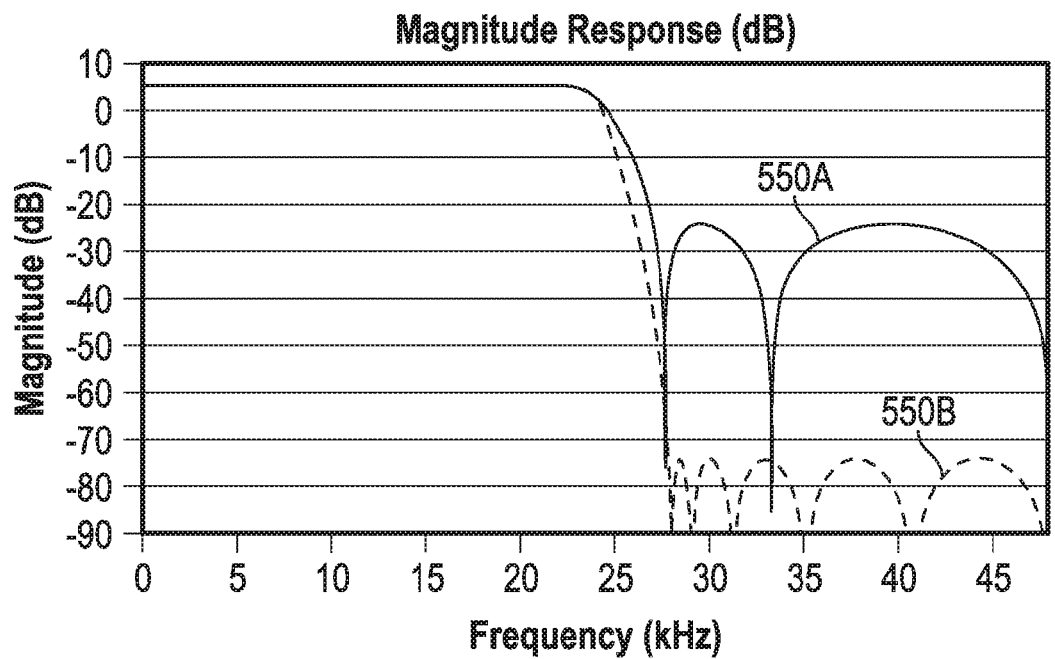
FIG. 5C illustrates generally illustrative examples of respective simulated magnitude response plots corresponding to the first and second filter implementations of FIG. 5A and FIG. 5B.

FIG. 5C illustrates generally illustrative examples of respective simulated magnitude response plots corresponding to the first and second filter implementations of FIG. 5A and FIG. 5B. As mentioned above, the $5^{th}$-order filter implementation has a response 550A showing a peak of about −25 dB in the stop-band, and the $11^{th}$-order filter implementation has a response 550B showing a peak of about −75 dB in the stop-band. As mentioned in relation to other examples herein, a discrete-time filter circuit can include an adjustable filter order, such as having a selectable filter order corresponding to the examples shown in FIG. 5A and FIG. 5B. The coefficients k1, k2, k3, k4, and k5 can be transitioned from initial values to target values, such as depending on an input signal envelope magnitude or other information. In this manner, a parameter such as stop band attenuation can be varied.

Figure 6A:
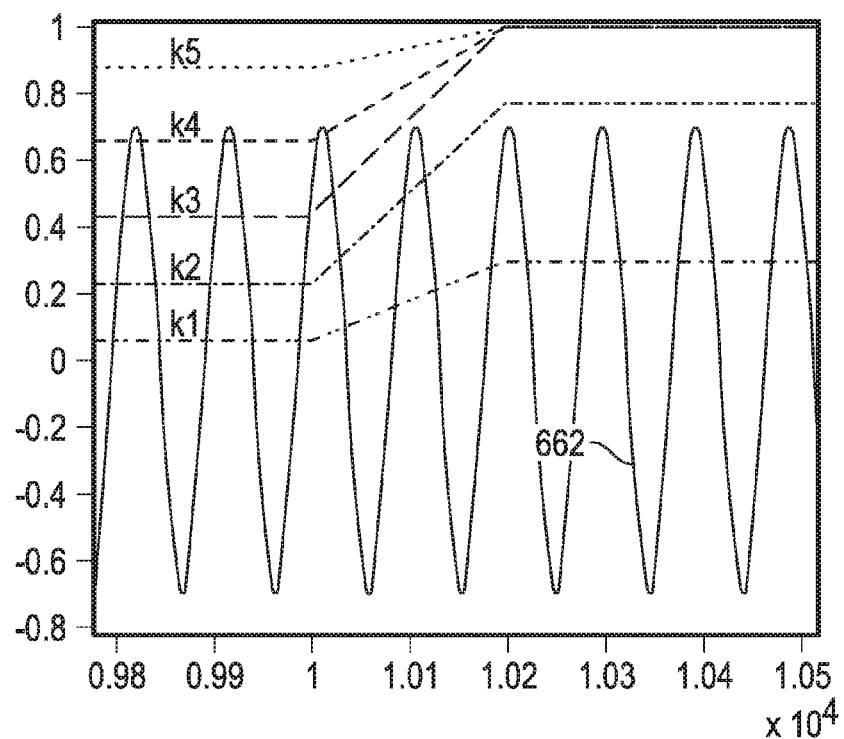
FIG. 6A illustrates generally illustrative examples of respective filter coefficients transitioning from the second specified filter order to the first specified filter order, using a first transition duration and a corresponding simulated time-domain output waveform.

FIG. 6A illustrates generally illustrative examples of a simulation of respective filter coefficients k1, k2, k3, k4, and k5 transitioning from the second specified filter order (e.g., an $11^{th}$-order response, corresponding to the implementation of FIG. 5B) to the first specified filter order (e.g., a $5^{th}$-order response, corresponding to the implementation of FIG. 5A), using a first transition duration and a corresponding simulated time-domain output waveform 662. After the coefficients k3, k4, and k5 have transitioned to within an specified margin of unity, the filter sections corresponding to coefficients k3, k4, k5 can be omitted from calculations (or hardware blocks corresponding to such filter elements can be bypassed or depowered), such as to achieve power savings when used a reduced stop-band attenuation. In the illustrative example of FIG. 6A, the ramping is linear and occurs over a duration of 100 samples. The resulting time-domain waveform 662 does not show visible distortion during the transition.

Figure 6B:
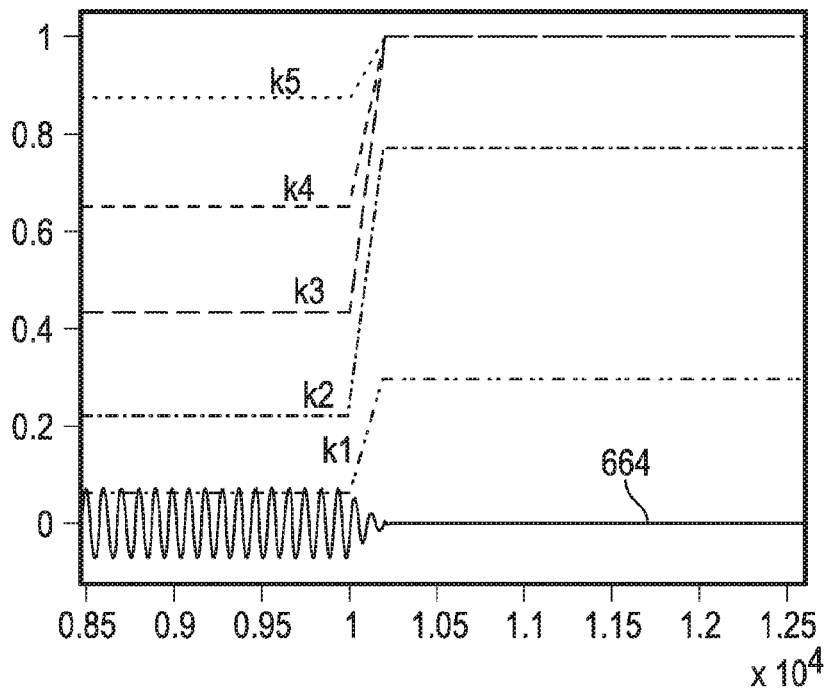
FIG. 6B illustrates generally illustrative examples of respective filter coefficients transitioning from the second specified filter order to the first specified filter order, and a corresponding simulated time-domain filter output error waveform.

FIG. 6B illustrates generally illustrative examples of a simulation of respective filter coefficients k1, k2, k3, k4, k5 transitioning from the second specified filter order to the first specified filter order in manner similar to FIG. 6A, and a corresponding simulated time-domain filter output error waveform 664, with the error waveform showing the desired output from the target filter after transitioning, as compared to the simulated filter output prior to and during transitioning.

Figure 7A:
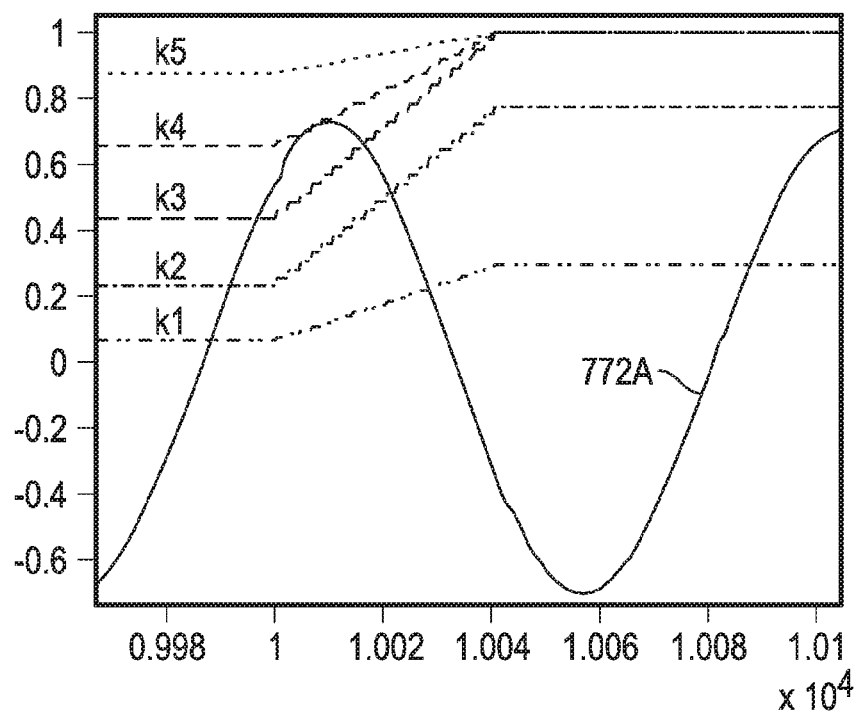
FIG. 7A illustrates generally illustrative examples of respective filter coefficients transitioning from the second specified filter order to the first specified filter order, and a corresponding simulated time-domain output waveform, in a manner similar to FIG. 6A but using a comparatively shorter transition duration.
Figure 7B:
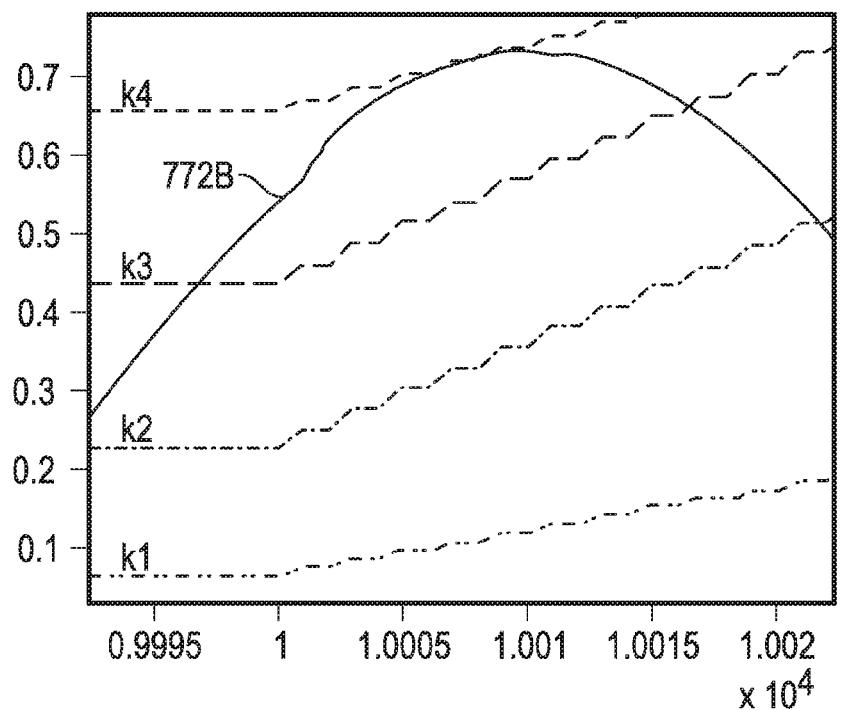
FIG. 7B illustrates generally illustrative examples of respective filter coefficients transitioning from the second specified filter order to the first specified filter order, and a zoomed-in representation of the corresponding simulated time-domain output waveform of FIG. 7A, showing transient waveform distortion.

FIG. 7A illustrates generally illustrative examples of respective filter coefficients k1, k2, k3, k4, and k5 transitioning from the second specified filter order to the first specified filter order, and a corresponding simulated time-domain output waveform 772A, in a manner similar to FIG. 6A but using a comparatively shorter transition duration of 20 samples, and FIG. 7B illustrates generally a zoomed-in representation 772B of the corresponding simulated time-domain output waveform of FIG. 7A, showing transient waveform distortion. The zoomed-in representation 772B shows time-domain distortion of the sinusoidal waveform as the coefficients k1, k2, k3, k4, and k5 are transitioned in discrete steps from their initial values to the target values. Accordingly, a tradeoff can exist between a transition duration for ramping the coefficients and corresponding induced distortion, where a shorter transition duration results in greater distortion. The illustrations of FIG. 6A, FIG. 6B, FIG. 7A, and FIG. 7B illustrate linear ramp for coefficient transitions, but other wave-shapes can be used. As mentioned in relation to various examples elsewhere, the ramping need not occur directly between an initial and a target value. For example, one or more intermediate filter orders can be selected, and a transition from an initial filter order to a target filter can occur in a piece-wise manner through one or more intermediate filter orders.

Figure 8A:
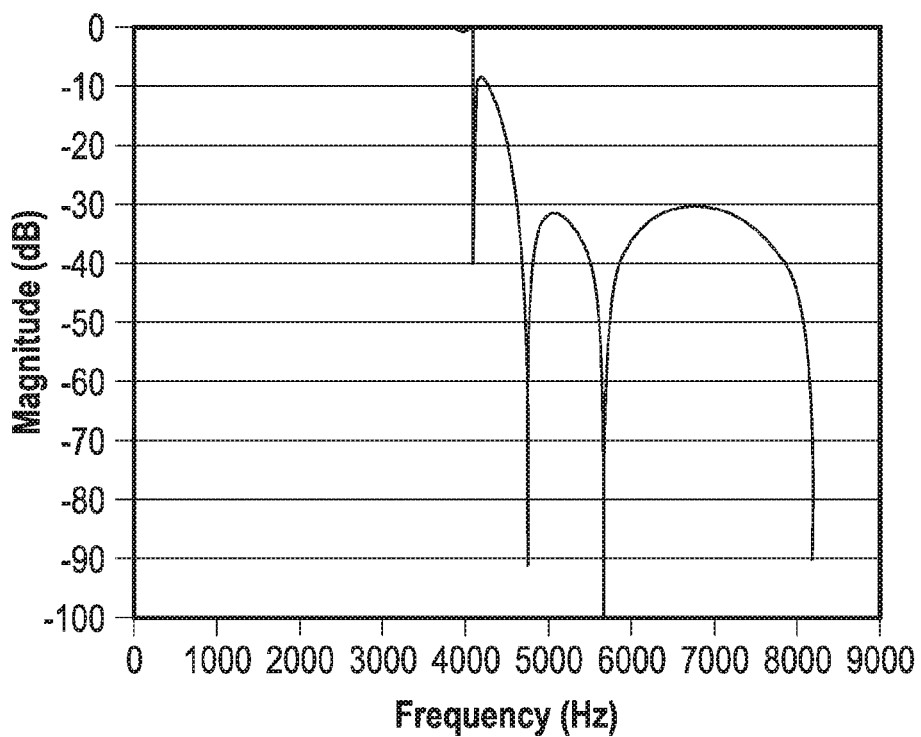
FIG. 8A illustrates generally an illustrative example of a simulated magnitude response of an adjustable-order discrete-time filter when configured to provide a first specified order corresponding to a first stop-band attenuation.
Figure 8B:
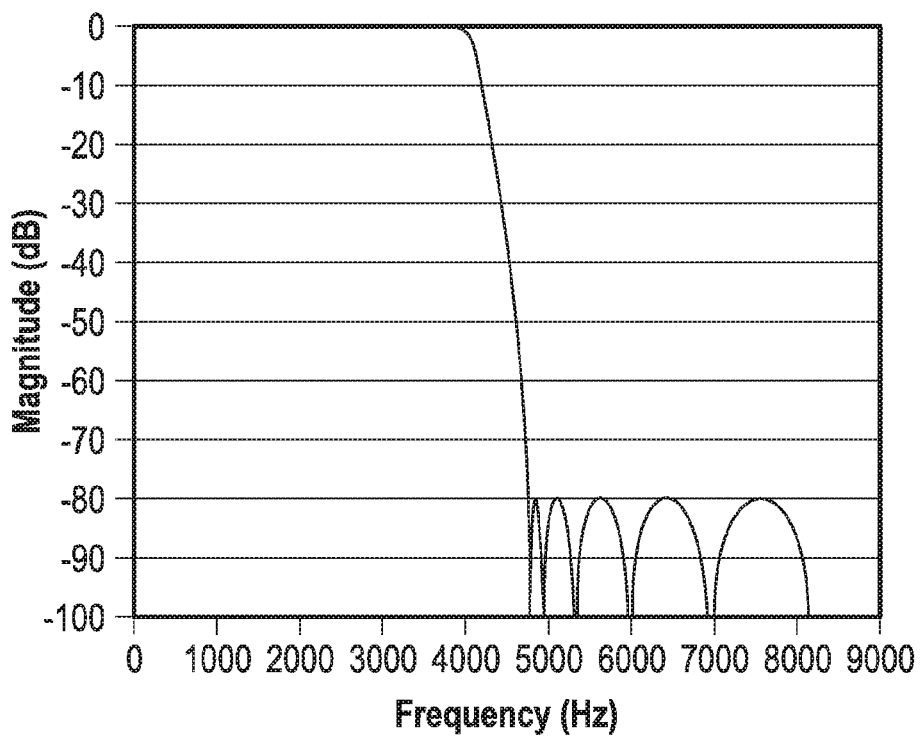
FIG. 8B illustrates generally an illustrative example of a simulated magnitude response of an adjustable-order discrete-time filter when configured to provide a second specified order corresponding to a second, greater stop-band attenuation.
Figure 9A:
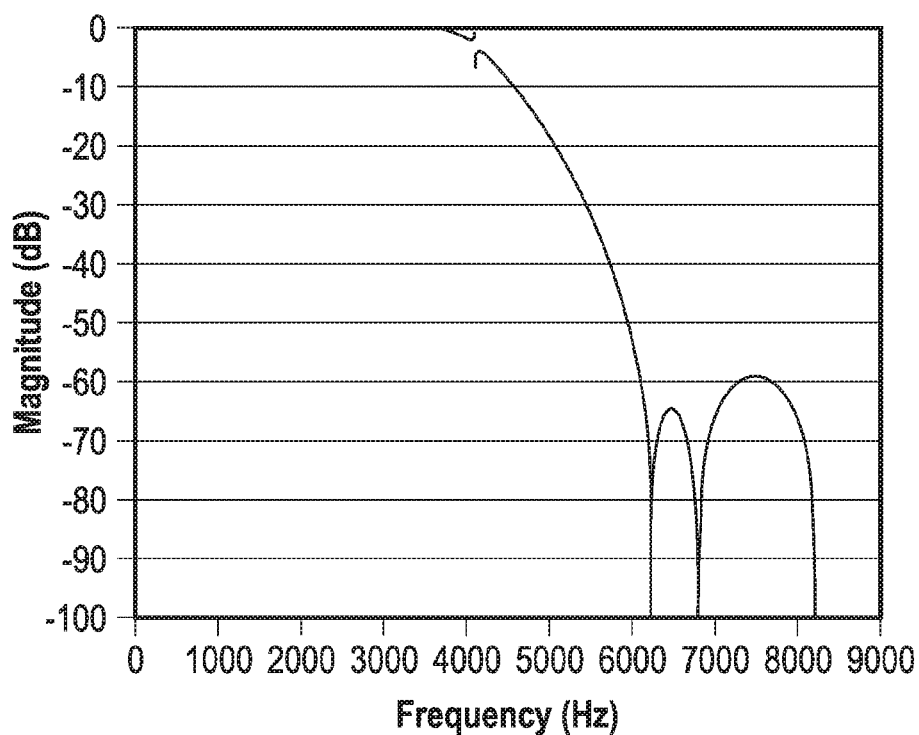
FIG. 9A illustrates generally an illustrative example of a simulated magnitude response of an adjustable-order discrete-time filter when configured to provide a first specified order corresponding to a first cut-off frequency.
Figure 9B:
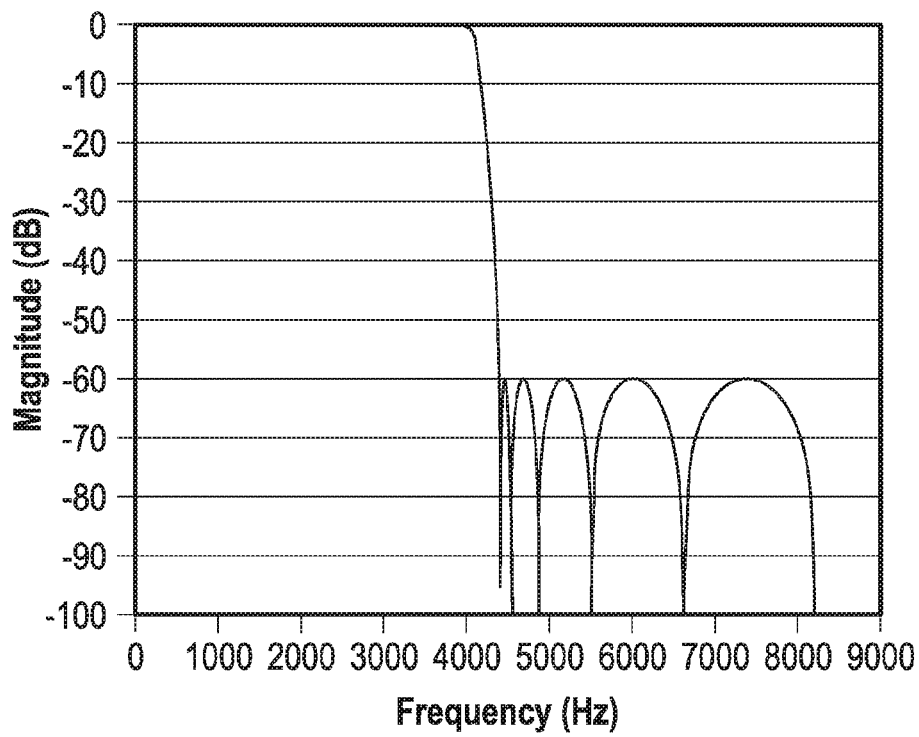
FIG. 9B illustrates generally an illustrative example of a simulated magnitude response of an adjustable-order discrete-time filter when configured to provide a second specified order corresponding to a second, higher cut-off frequency.

As discussed elsewhere herein, using an adjustable filter order can provide a selectable stop-band attenuation, such as to relax a stop-band attenuation when an input signal magnitude is lower. FIG. 8A illustrates generally an illustrative example of a simulated magnitude response of an adjustable-order discrete-time filter when configured to provide a first specified order corresponding to a first stop-band attenuation, such as about −30 dB. Similarly, FIG. 8B illustrates generally an illustrative example of a simulated magnitude response of an adjustable-order discrete-time filter when configured to provide a second specified order corresponding to a second, greater stop-band attenuation of about −80 dB. However, other filter parameters can be adjusted such as by selectively varying the filter order. For example, FIG. 9A illustrates generally an illustrative example of a simulated magnitude response of an adjustable-order discrete-time filter when configured to provide a first specified order corresponding to a first cut-off frequency and FIG. 9B illustrates generally an illustrative example of a simulated magnitude response of an adjustable-order discrete-time filter when configured to provide a second specified order corresponding to a second, higher cut-off frequency, where the second specified order is greater than the first specified filter order. Accordingly, the roll-off shown in the magnitude response of FIG. 9B is also more rapid versus frequency than the roll-off shown in FIG. 9A.

Figure 10A:
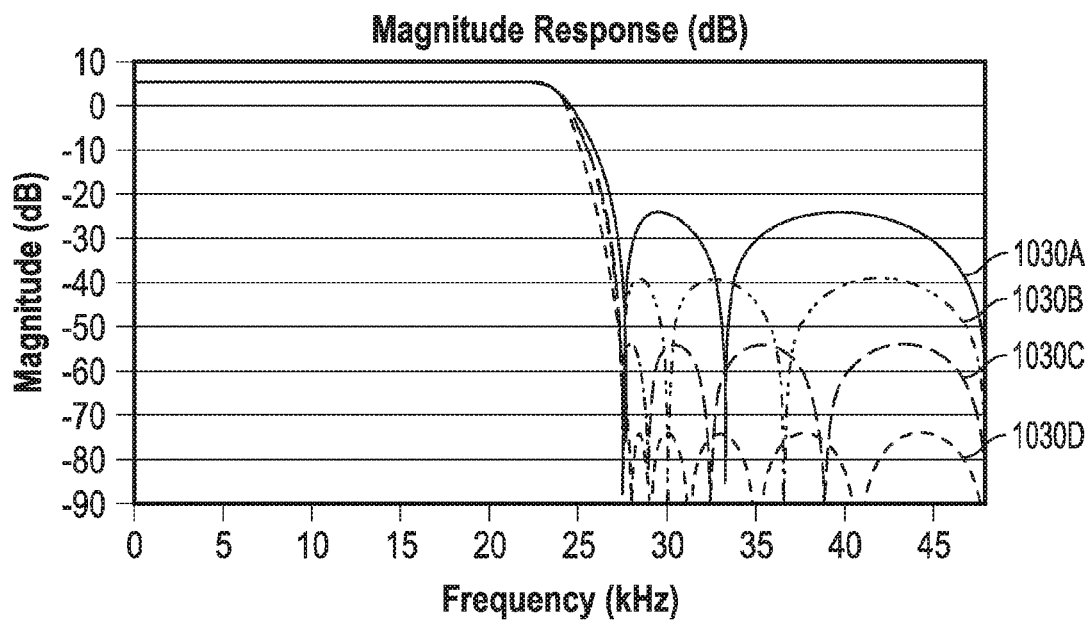
FIG. 10A illustrates generally an illustrative example of a simulated magnitude responses of respective filter orders of an adjustable-order discrete-time filter, illustrating generally various responses as the filter transitions through respective intermediate specified filter orders.

The illustrations of FIG. 6A, FIG. 6B, FIG. 7A, and FIG. 7B illustrate linear ramp for coefficient transitions, but other wave-shapes can be used. Moreover, the ramping or other transitioning need not occur directly between an initial and a target value. For example, one or more intermediate filter orders can be selected, and a transition from an initial filter order to a target filter can occur in a piece-wise manner through one or more intermediate filter orders. FIG. 10A illustrates generally an illustrative example of a simulated magnitude responses of respective filter orders of an adjustable-order discrete-time filter, illustrating generally various responses as the filter transitions through respective intermediate specified filter orders. The filter orders include $5^{th}$-order magnitude response 1030A, a $7^{th}$-order magnitude response 1030B, a $9^{th}$-order magnitude response 1030C, and an $11^{th}$-order magnitude response 1030C. Use of intermediate filters facilities use of a smaller step-size in the respective filter coefficients during transitioning, and may preserve the desired filter response (e.g., a low-pass shape) because the ultimate transition from an initial filter order to a final target filter order passes through intermediate steps having a known response. For example, the order of transitions could be 1030D to 1030C to 1030B to 1030A, or vice versa.

Figure 10B:
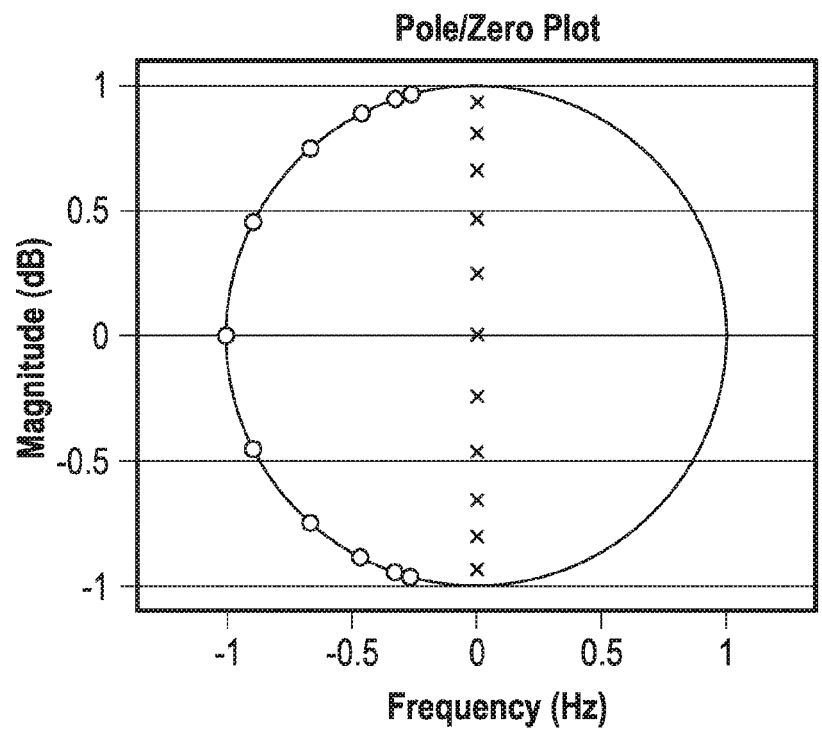
FIG. 10B illustrates generally an illustrative example of a simulated pole-zero constellation corresponding to an initial state of the adjustable-order discrete-time filter simulated in FIG. 10A.
Figure 10C:
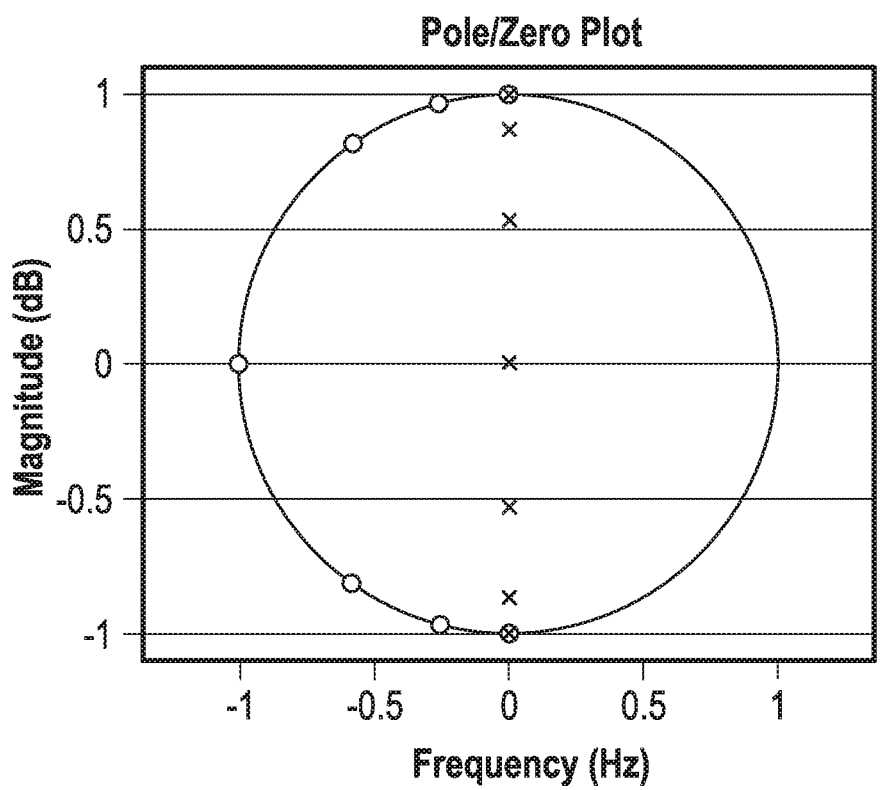
FIG. 10C illustrates generally an illustrative example of a simulated pole-zero constellation corresponding to a target state of the adjustable-order discrete-time filter simulated in FIG. 10A.

FIG. 10B illustrates generally an illustrative example of a simulated pole-zero constellation corresponding to an initial state of the adjustable-order discrete-time filter simulated in FIG. 10A, such as having a magnitude response corresponding to the $5^{th}$-order response 1030A just before elimination of the superfluous zeroes corresponding to filter stages having coefficients, k=1. Similarly, FIG. 10C illustrates generally an illustrative example of a simulated pole-zero constellation corresponding to a target state of the adjustable-order discrete-time filter simulated in FIG. 10A, such as having a magnitude response corresponding to the $11^{th}$-order response 1030D.

Figure 11:
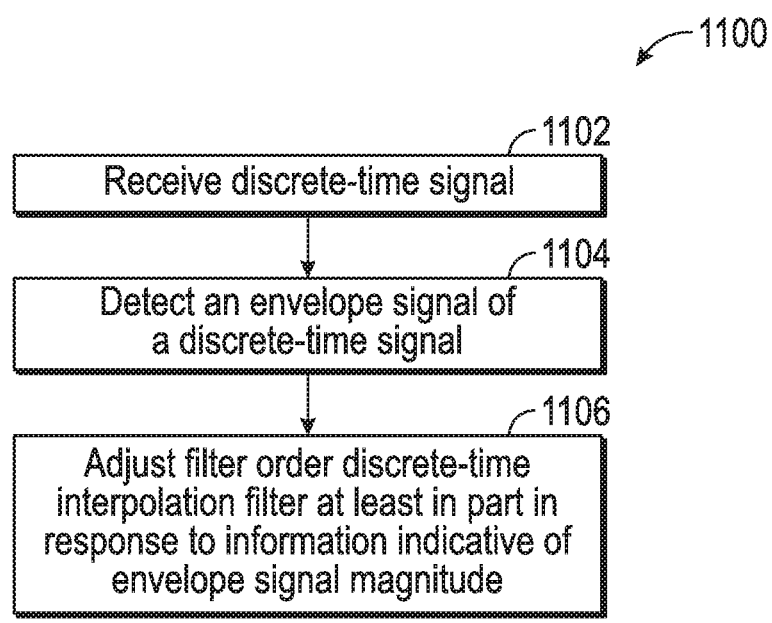
FIG. 11 illustrates generally a technique, such as a method, that can include receiving a discrete-time signal, detecting an envelope signal of the discrete-time signal, and adjusting a filter order of a discrete-time filter at least in part in response to information indicative of a magnitude of the envelope signal.

FIG. 11 illustrates generally a technique 1100, such as a method, that can include at 1102 receiving a discrete-time signal (e.g., a digital signal), and at 1104, detecting an envelope signal of the discrete-time signal, and at 1106 adjusting a filter order of a discrete-time filter, such as an interpolation filter, at least in part in response to information indicative of a magnitude of the envelope signal. The technique of FIG. 11 can be performed such as when included in operation of a portion of a sigma-delta over-sampling digital-to-analog conversion circuit, though the technique 1100 is not restricted to such an application. The technique 1100 can include or use portions of other aspects described herein, such as shown and described in relation to FIG. 1, FIG. 2, FIG. 3A, or FIG. 4, as illustrative examples.

While many of the examples discussed above refer to an infinite impulse response (IIR) filter arranged as a half-band filter, the techniques described herein (e.g., using a discrete-time filter having an adjustable filter order) can be applied to other filter topologies for other applications. For example, the use of a discrete-time all-pass topology is illustrative, and other filter topologies can be used, such as can include a biquadratic topology, a direct-form I or direct-form II topology, or other topologies. An all-pass half-band topology, as described elsewhere herein, preserves stability when transitioning through intermediate filter orders.

Various Notes

Each of the non-limiting aspects described herein can stand on its own, or can be combined in various permutations or combinations with one or more of the other examples. The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A signal processing circuit configured to control a digital interpolation filter having an adjustable filter order, the signal processing circuit comprising:
   a digital signal input;
   a digital peak detector circuit coupled to the digital signal input, the digital peak detector circuit configured to provide information indicative of an envelope signal of a digital signal received from the digital signal input, the envelope signal having an envelope bandwidth less than a bandwidth of the digital signal; and
   an interpolation filter control circuit configured to adjust a filter order of the digital interpolation filter at least in part in response to information indicative of an envelope signal magnitude.

2. The signal processing circuit of claim 1, wherein the interpolation filter control circuit comprises a comparator coupled to the envelope signal, the comparator configured to compare the envelope signal magnitude against a specified threshold, and the comparator including an output coupled to the interpolation filter control circuit for use by the interpolation filter control circuit in adjustment of the filter order in response to the comparison.

3. The signal processing circuit of claim 2, wherein the interpolation filter control circuit is configured to increase a stop-band attenuation by increasing the interpolation filter order when the comparator indicates that the envelope signal magnitude is above the specified threshold.

4. The signal processing circuit of claim 1, wherein configured to adjust a stop-band edge location by adjusting the filter order at least in part in response to information indicative of the envelope signal magnitude.

5. The signal processing circuit of claim 1, wherein the interpolation filter control circuit is configured to adjust the filter order including ramping at least one of the filter coefficients from a respective initial value corresponding to an initial filter order to a respective target value corresponding to a target filter order.

6. The signal processing circuit of claim 5, wherein the ramping includes linear ramping.

7. The signal processing circuit of claim 1, further comprising the interpolation filter.

8. The signal processing circuit of claim 7, wherein the interpolation filter comprises a first-order digital all-pass filter section.

9. The signal processing circuit of claim 1, comprising:
   a digital interpolation filter section;
   a digital signal buffer;
   a multiplexer section selectively coupling at least one of the digital signal input and the digital signal buffer to the digital interpolation filter section;
   a sequencer configured to control the multiplexer section and the interpolation filter section to provide the adjustable filter order, the sequencer coupled to the filter control circuit to receive and store interpolation filter coefficients and corresponding multiplexer section states.

10. The signal processing circuit of claim 9, wherein the digital interpolation filter section comprises a first-order all-pass filter section; and
   wherein an input of the digital signal buffer is coupled to an output of the first-order all-pass filter section;
   wherein the sequencer is configured to sequentially control the multiplexer section and the first-order all-pass filter coefficient, K, to implement a higher-order interpolation filter in a serialized manner.

11. The signal processing circuit of claim 10, wherein the sequencer is configured to omit or bypass a filtering operation when a value of the coefficient, K, for use in the filtering operation, is at unity.

12. The signal processing circuit of claim 11, wherein the sequencer is configured to omit or bypass a filtering operation when a value of the coefficient, K, for use in the filtering operation, is within a specified margin lesser in magnitude than unity.

13. A method for controlling a digital interpolation filter having an adjustable filter order, the method comprising:
receiving a digital signal;
detecting an envelope signal of a digital signal using a digital peak detector, the envelope signal having an envelope bandwidth less than a bandwidth of the digital signal;
determining an envelope signal magnitude; and
adjusting a filter order of a digital interpolation filter at least in part in response to information indicative of the envelope signal magnitude.

14. The method of claim 13, comprising comparing the envelope signal magnitude against a specified threshold; and
adjusting the filter order in response to the comparison.

15. The method of claim 14, wherein adjusting the filter order in response to the comparison includes increasing a stop-band attenuation by increasing the filter order when the comparator indicates that the envelope signal magnitude is above the specified threshold.

16. The method of claim 13, wherein adjusting the filter includes ramping at least one of the filter coefficients from a respective initial value corresponding to an initial filter order to a respective target value corresponding to a target filter order.

17. The method of claim 13, wherein the digital interpolation filter section comprises a first-order all-pass filter section; and
wherein the method includes sequentially controlling the first-order all-pass filter coefficient, K, to implement a higher-order interpolation filter including feeding inputs to the first-order all-pass filter in a serialized manner.

18. The method of claim 17, comprising omitting a filtering operation in the sequentially controlling the first-order all-pass filter, when a value of the coefficient, K, for use in the filtering operation, is at unity.

19. The method of claim 17, comprising omitting a filtering operation in the sequentially controlling the first-order all-pass filter, when a value of the coefficient, K, for use in the filtering operation, is within a specified margin lesser in magnitude than unity.

20. A sigma-delta over-sampling digital-to-analog conversion circuit, comprising:
a digital signal input;
a digital interpolation filter having an adjustable filter order;
an envelope detector circuit coupled to the digital signal input, the envelope detector circuit configured to provide information indicative of an envelope signal of a digital signal received from the digital signal input, the envelope signal having an envelope bandwidth less than a bandwidth of the digital signal; and
an interpolation filter control circuit configured to adjust a filter order of the digital interpolation filter at least in part in response to information indicative of an envelope signal magnitude;
a digital sigma-delta modulator coupled to an output of the digital interpolation filter; and
a current-mode digital-to-analog conversion (DAC) circuit coupled to the output of the digital sigma-delta modulator, the current-mode DAC configured to provide an analog output signal representative of the digital input signal.

\* \* \* \* \*